United States Patent [19]

Hamburg

[11] 3,807,816

[45] Apr. 30, 1974

[54] CIRCUIT USING LIMITED RANGE OPERATORS TO OPERATE ON WIDE DYNAMIC RANGE SIGNALS

[75] Inventor: James A. Hamburg, Southfield, Mich.

[73] Assignee: General Motors Corporation, Detroit, Mich.

[22] Filed: Mar. 29, 1973

[21] Appl. No.: 345,960

[52] U.S. Cl. .................. 328/143, 324/132, 328/163

[51] Int. Cl. .................. G06g 7/20

[58] Field of Search .................. 328/143, 147, 163; 307/235; 324/119, 132

[56] References Cited

UNITED STATES PATENTS 3,596,107 7/1971 Kittrell .................. 328/147 X

*Primary Examiner*—Herman Karl Saalbach
*Assistant Examiner*—James B. Mullins
*Attorney, Agent, or Firm*—Warren D. Hill

[57] ABSTRACT

A root mean square circuit having a wide dynamic range input signal includes one path comprising a limited range RMS module, a parallel path having a X10 amplifier in series with a similar RMS module and a X1/10 attenuator and another parallel path having an X100 amplifier, a similar RMS module and a X1/100 attenuator. An idealized diode selector circuit selects the maximum signal from the three paths. Since each module is only accurate within its range and its output diminishes outside its range, the largest output of the three paths represents the true RMS signal.

3 Claims, 2 Drawing Figures

CIRCUIT USING LIMITED RANGE OPERATORS TO OPERATE ON WIDE DYNAMIC RANGE SIGNALS

This invention relates to an electronic circuit comprising limited range operators for operating on a wide dynamic range input signal.

It is often desired, for example in analog computers, to provide an electronic operator circuit to generate a mathematical function of an input signal having a dynamic range which is wider than the range of available operator circuits. Previously it has been known to manually or automatically change ranges in a circuit according to the value of the input signal; however, that technique is not practical for use with a wide dynamic range input signal wherein the value of the signal may rapidly vary between large and small values. Thus it is desirable to provide a multi-range circuit requiring no switching.

It is therefore an object of the invention to provide a circuit capable of accurately operating upon a wide dynamic range input signal using limited range operators.

It is a further object of the invention to provide a multi-range circuit for operating upon a wide dynamic range signal without the use of switching devices.

The invention is carried out by providing a circuit with two or more parallel paths simultaneously responsive to an input signal with wide dynamic range. One path includes a limited range operator, a second path includes an amplifier responsive to the input signal, an operator similar to that in the first path, and a second amplifier having a gain the inverse of that of the first amplifier. Any additional parallel paths are similar to the second except that the amplifier gains are sufficiently different to allow the operator to accurately respond to signals outside the range of the other operators. The parallel paths terminate in a circuit that selects the maximum signal and passes it to an output. More particularly, the invention is carried out by using RMS modules as the operators and wherein the first amplifier in each path has a gain greater than one and the second amplifier is an attenuator such as a voltage divider.

The above and other advantages will be made more apparent from the following specification taken in conjunction with the accompanying drawings wherein like reference numerals refer to like parts and wherein.

The preferred embodiment of this invention is a root mean square circuit which will operate on large dynamic range signals using limited range RMS modules. It will accurately determine the true RMS value of an input wave form spanning a 60 dB dynamic range while using RMS circuit modules which individually are accurate over a range of only 20 dB. This circuit has been applied to a system performing an RMS operation on an audio signal wherein range switching to bring the signal within the amplitude range of an RMS circuit module is not feasible.

Figure 1:
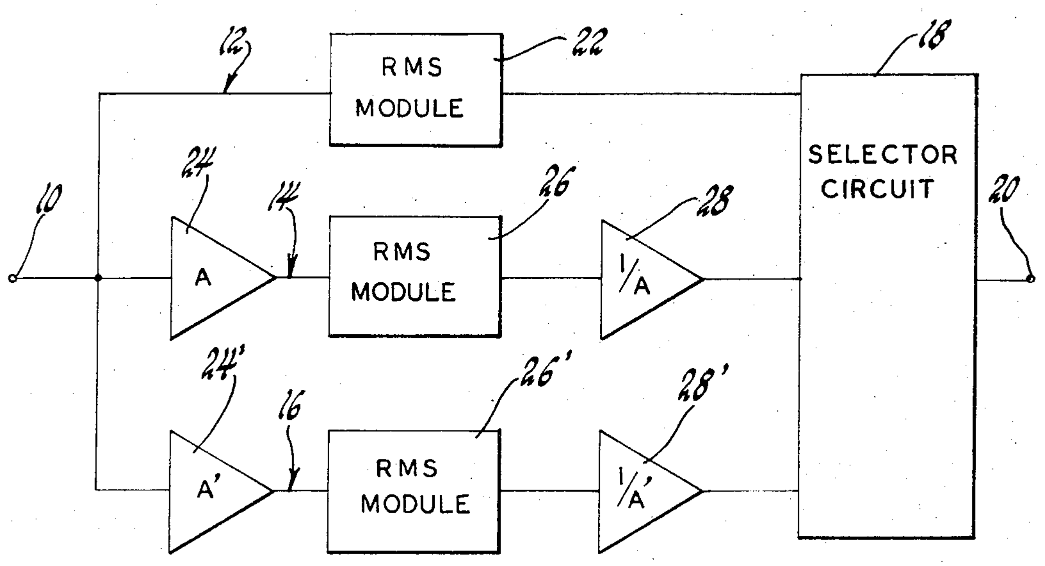
FIG. 1 is a block diagram of a circuit according to the invention.

The circuit as illustrated in FIG. 1 includes an input terminal 10 for receiving an input signal of wide dynamic range. Three parallel operator circuits 12, 14 and 16 are connected between the input terminal 10 and a selector circuit 18 which selects the maximum signal from the three parallel circuits and passes that signal to an output terminal 20. The operating path 12 comprises only an operator, specifically an RMS module 22. The path 14 includes an amplifier 24 having a gain A in series with an RMS module 26 followed by an amplifier 28 having a gain 1/A. Preferably the gain A equals 10. The operator path 16 is generally similar to the path 14 and includes an amplifier 24' having a gain A', an RMS module 26' and an amplifier 28' having a gain of 1/A', the gain A' is preferably equal to 100. The characteristic of the RMS module is that it has a limited dynamic range through which it is accurate. For input signals outside that range the output is lower than the true RMS value of the input signal. Thus the operator 22 is chosen to be suitable for accurately operating on the higher values of the input signal. Thus for large input signals, the true RMS value is fed to the selector circuit 18 on path 12. In the second path 14, the amplifier 24 increases the input signal to a value outside the accurate range of the operator 26 so that the operator circuit is disproportionately low. After that output is attenuated by the amplifier 28, it will be lower than the signal from the operator 22. Similarly, the path 16 produces a low output signal. Thus the accurate signal from the operator 22 is the maximum signal fed to the selector circuit 18 and that signal is passed to the output terminal 20.

When the input signal drops to a value slightly outside the range of the operator 22, then the output of that operator will be lower than the true RMS value of the amplifier 24. However, the amplifier 24 increases the input signal to a value within the accurate range of the operator 26 such that the operator 26 output accurately reflects the RMS value of the input but for the gain of the amplifier 24. The amplifier 28 compensates for the gain of the amplifier 24 so that the output of the path 14 is the true RMS value of the input signal. In path 16, the amplifier 24' increases the input signal to a value beyond the range of the operator 26' so that the output of path 16, like that of path 12, will be low. Thus the true RMS value from path 14 will be the maximum signal selected by the circuit 18. When the input signal drops even lower, such that the operator 26 is no longer functioning in its accurate range, then the path 16 produces an accurate output signal which is larger than the signals produced in paths 12 and 14.

Thus the circuit in FIG. 1 provides for three ranges of operation each handled by one of the operating paths 12, 14 and 16. Each range being adjacent to the other so that there is no hiatus during which the input signal is not accurately operated upon by one path or another. When a signal operating in the high range drops to a medium or lower range value, then the output of the path 14 or path 16 becomes larger than that of path 12 and the larger overcomes the weaker signals in the selector circuit 18 so that the range operation of the circuit is instantly converted from one circuit path to another without the use of any switching devices for effecting the change. The three paths are always simultaneously in operation although only one path is effective to provide the output signal at terminal 20 at a given instant.

It can readily be seen that more than three operating paths may be used if it is required to extract information for extremely low input signals or if the operators in use have such narrow useful ranges that a larger number is required to cover the required input signal range.

Where, as is contemplated in the preferred embodiment, the amplifier 24 has a gain greater than unity, a transistorized amplifier may be used. The amplifier 28 may also assume the form of a transistorized amplifier of gain less than unity in order to attenuate the signal, but another form of attenuator such as a simple voltage divider may be used for that purpose. In any event, the term "amplifier" as used in this specification is intended to include attenuation devices such as voltage dividers.

It should be noted that it may in some applications be desirable to use the operating path 12 for the low range of operation and to allow the operating paths 14 and 16 to accommodate higher values of input signals. In that circumstance, the amplifiers 24 and 24' would have gains less than unity and the amplifiers 28 and 28' would of course have gains greater than unity. Obviously, the principle of operation would be the same.

Figure 2:
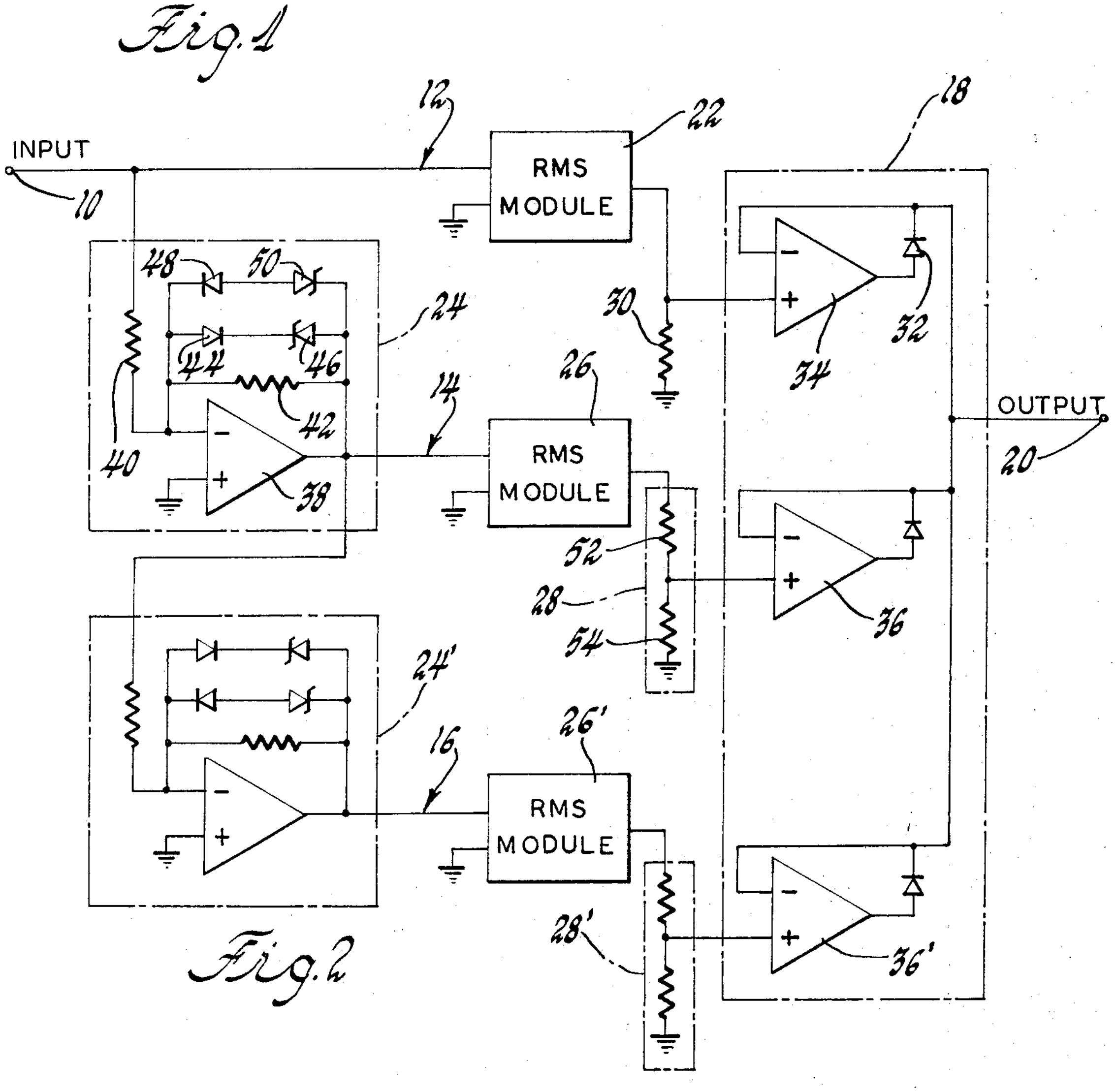
FIG. 2 is a schematic diagram of the circuit according to the invention.

FIG. 2 depicts a specific circuit to be used for the circuit of FIG. 1. The operating path 12 includes the RMS module 22 connected to the terminal 10 and its output is connected to ground through resistor 30 and to the selector circuit 18. While a simple diode selector circuit could be used to extract the signal with the largest magnitude, the diode voltage drops would distort the output. Accordingly, an idealized diode circuit is used comprising a diode 32 in the feedback circuit of an operational amplifier 34. The positive input of the operational amplifier is connected to the output of the RMS module 22. The output terminal 20 is connected between the diode 32 and the negative input terminal of the amplifier 34. The operational amplifier corrects the error introduced by the diode resulting in an idealized diode circuit. Similar circuits 36 and 36' are used at the outputs of paths 14 and 16.

In the path 14, the amplifier 24 includes an operational amplifier 38 having a grounded positive input terminal and its negative input terminal connected through an input resistor 40 to the input terminal 10. A feedback circuit between the output terminal and the negative input terminal of the operational amplifier 38 includes a feedback resistor 42 in parallel with two diode paths. One of the paths includes a diode 44 and an oppositely poled zener diode 46 and the second diode path includes a diode 48 and a zener diode 50 of opposite polarity to those in the first diode path. The zener diodes are provided to limit the amplifier output to ±10 volts. This limiting assures that for input signals higher than the intended range of the RMS module 26 the circuit path 14 will be limited to an output lower than that of path 12, whereas for input signals within the range of the path 14, the amplifier 24 will operate within a linear range. The output of the RMS module 26 is connected to an attenuator 28 which is a voltage divider comprising serially connected resistors 52 and 54 having their mid-point connected to the selector circuit 18. The attenuator 28 is equivalent to the amplifier 28 of less than unity gain in FIG. 1. In path 16 the amplifier 24' is structurally identical to amplifier 24. As a convenience in circuit design, the input of the amplifier 24' is taken from the output of the amplifier 24 so that where each amplifier has a gain of 10, the overall effective gain at the output of amplifier 24' is 100. The amplifier 28' in path 16 is a voltage divider similar to amplifier 28 but the resistors are chosen to provide an attenuation factor of 100.

A specific example of the circuit in operation is shown in the following table.

| Input Signal Peak to Peak | | RMS Module Input | RMS Module Output (DC) | Selector Circuit Input | Selector Circuit Output |
|---|---|---|---|---|---|
| | path 12 | 5.0 v | 3.54 v | 3.54 v | |
| 5 volt | path 14 | 10.0 | 10. | 1.0 | 3.54 v |
| | path 16 | 10.0 | 10. | 0.1 | |
| | path 12 | 0.5 | 0.336 | 0.336 | |
| 0.5 volt | path 14 | 5.0 | 3.54 | 0.354 | 0.354 |
| | path 16 | 10.0 | 10.0 | 0.1 | |
| | path 12 | 0.05 | 0.027 | 0.027 | |
| 0.05 | path 14 | 0.5 | 0.336 | 0.0336 | 0.0354 |
| | path 16 | 5.0 | 3.54 | 0.0354 | |

Assume the input is a 5 volt peak sine wave. The RMS module 22 in the path 12 receives a 5 volt signal, determines its RMS value which is 3.54 volts DC, and feeds it to the selector circuit 18. In the path 14 the signal is amplified by a factor of 10 but is limited to a peak value of ±10 volts which is fed to the RMS module 26. The RMS value of the 10 volt wave (now a square wave due to limiting) is 10 volts. This is attenuated by a factor of 10 to provide a signal of 1 volt fed to the selector circuit 18. In the path 14 the same thing happens except that the output of RMS module is attenuated by a factor of 100 which is fed to the selector circuit (0.1 volt). The selector circuit picks the signal which has the large amplitude (3.54 volts) and uses it for the output. This is the correct value of a 5 volt peak sine wave.

Assuming an input signal of 0.05 volt peak sine wave, it is seen that in the path 12 the RMS module receives a 0.05 volt signal. Since the amplitude is below the useful accurate range of the module this amplitude will be inaccurate and turns out to be 0.027 volts. This signal is fed to the selector circuit. In the path 14 the signal is amplified by a factor of 10 and the RMS module receives a signal of 0.5 volts. The output of the RMS module is 0.336 volts which is then attenuated by a factor of 10 to provide a signal of 0.0336 volts fed to the selector circuit. In the path 16 the signal is amplified by 100 and the RMS signal receives a signal of 5 volts. The output of this RMS module is 3.54 volts which is then attenuated by a factor of 100 to provide a signal of 0.0354 volts which is fed to the selector circuit. The selector signal again picks the signal which has the largest amplitude and uses it for the output. This is the correct value for the 0.05 volt peak sine wave. It is clearly seen in the table that when the RMS modules receive voltages less than 1 volt the output gradually becomes lower than the true RMS valve.

It will thus be seen that the circuit according to this invention adjusts the amplitude of the input signal so that it falls within the dynamic range of one of the three RMS modules and then the scaled output of the module is automatically selected to be the output of the circuit. Thus the accuracy of the RMS operation is insured as always being within the operating range of a module. It is further seen that no switching devices are required in the circuit since the maximum signal from the operating paths simply predominates over the weaker signals fed to the idealized diode selector circuit.

It will further be seen that the principle of this invention may be applied to certain types of operators other than RMS modules. For example, averagers, squarers or square root devices with limited dynamic ranges could be used in this same configuration. It will be necessary to adjust the attenuators to reflect the actual module function.

The embodiment of the invention described herein is for purposes of illustration and the scope of the invention is intended to be limited only by the following claims:

What is claimed is:

1. A circuit for providing a wide dynamic range using limited range operators comprising:

an input terminal for receiving an input signal of wide dynamic range, and an output terminal, a first operator path including a first limited range operator connected to the input terminal for operating upon the input signal and producing a first output signal, the operator being accurate throughout its limited range and having an undesirably low output outside its limited range, at least one additional operator path in parallel with the first limited range operator, each additional operating path producing an additional output signal, each additional operating path including a first amplifier serially connected to the input terminal and to an additional limited range operator having substantially the same characteristics as the first operator, the first amplifier in each operating path having a different gain, and further including a second amplifier having a gain which is the inverse of the first amplifier gain, the second amplifier being connected to the second operator to provide the additional output signal, and circuit means responsive to the first and additional output signals and connected to the output terminal for selecting the maximum output signal and passing said maximum output signal to the output terminal whereby the circuit accurately responds to input signals having a dynamic range wider than that of the individual limited range operators.

2. A circuit for providing a wide dynamic range using limited range operators comprising, an input terminal for receiving an input signal of wide dynamic range and an output terminal, a first limited range operator connected to the input terminal for operating upon the input signal and producing a first output signal, the operator being accurate throughout its limited range and having an undesirably low output outside its limited range, an amplifier serially connected to the input terminal and to a second limited range operator having substantially the same characteristics as the first operator, the gain of the amplifier being sufficient to bring input signal values just outside the range of the first operator into the range of the second operator, means modifying the output of the second operator by a factor having the inverse value of the amplifier gain for producing a second output signal, and circuit means responsive to the first and second output signals and connected to the output terminal for selecting the maximum output signal and passing said maximum signal to the output terminal whereby the circuit accurately responds to the input signal having a dynamic range wider than that of the individual limited range operators.

3. A circuit for providing a wide dynamic range using limited range operators comprising:

an input terminal for receiving an input signal of wide dynamic range, and an output terminal, a first operator path including a first limited range operator connected to the input terminal for operating upon the input signal and producing a first output signal, the operator being accurate throughout its limited range and having an undesirably low output outside its limited range, at least one additional operator path in parallel with the first limited range operator, each additional operating path producing an additional output signal, each additional operating path including an amplifier serially connected to the input terminal and to an additional limited range operator having substantially the same characteristics as the first operator, the amplifier in each operating path having a different gain greater than unity and being limited to a maximum output voltage coincident with the upper end of the operator's range, and further including attenuation means having an attenuation factor which is the inverse of the amplifier gain, the attenuation means being connected to the additional operator to provide the additional output signal, and an idealized diode circuit means responsive to the first and additional output signals and connected to the output terminal for selecting the maximum output signal and passing said maximum output signal to the output terminal whereby the circuit accurately responds to input signals having a dynamic range wider than that of the individual limited range operators.

* * * * *

PO-1050
(5/69)

UNITED STATES PATENT OFFICE
CERTIFICATE OF CORRECTION

Patent No. 3,807,816 Dated April 30, 1974

Inventor(s) James A. Hamburg

It is certified that error appears in the above-identified patent and that said Letters Patent are hereby corrected as shown below:

Column 2, line 21, after "operator" 2nd, occ., insert -- output --
line 22, before "is", first occurrence, delete --circuit--,
Column 4, line 17, after "input" insert --signal--.

Signed and sealed this 29th day of October 1974.

(SEAL)
Attest:

McCOY M. GIBSON JR.
Attesting Officer

C. MARSHALL DANN
Commissioner of Patents